(12) United States Patent
Huang et al.

(10) Patent No.: US 7,487,488 B1
(45) Date of Patent: Feb. 3, 2009

(54) PREDICTABLE REPEATER ROUTING IN AN INTEGRATED CIRCUIT DESIGN

(75) Inventors: Dajen Huang, Sunnyvale, CA (US); Yi Wu, Santa Clara, CA (US); Arjun Dutt, Santa Clara, CA (US); Yu L. Zheng, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 186 days.

(21) Appl. No.: 11/544,105

(22) Filed: Oct. 6, 2006

(51) Int. Cl.
*G06F 17/50* (2006.01)
(52) U.S. Cl. .......................................... 716/14; 716/10
(58) Field of Classification Search ................ 716/6, 716/12–14, 10
See application file for complete search history.

(56) References Cited

U.S. PATENT DOCUMENTS

| | | | |
|---|---|---|---|
| 6,408,426 B1 | 6/2002 | Josephson et al. | |
| 6,477,690 B1 | 11/2002 | Witte et al. | |
| 6,928,401 B1 | 8/2005 | Wanek | |
| 6,996,512 B2 | 2/2006 | Alpert et al. | |

*Primary Examiner*—Stacy A Whitmore
(74) *Attorney, Agent, or Firm*—Hickman Palermo Troung & Becker LLP

(57) ABSTRACT

A mechanism is disclosed for assigning repeaters to signal paths in an integrated circuit design. The mechanism involves reserving, in a first metal layer of the integrated circuit design, metal tracks for routing signals. Access points to a plurality of repeaters are reserved in a second metal layer of the integrated circuit design. Each access point is associated with a particular repeater. The design may have other layers between the second metal layer and a region reserved for the repeaters. The number of repeaters may be based on the number of metal tracks that are available to route signals through the first region. Signal paths are assigned routes that comprise at least a portion of one or more of the metal tracks. A route from signal paths requiring a repeater to access points to a particular repeater is determined. Thus, the signal paths are assigned to a repeater.

20 Claims, 4 Drawing Sheets

PREDICTABLE REPEATER ROUTING IN AN INTEGRATED CIRCUIT DESIGN

BACKGROUND

Integrated circuits (chips) comprise many different components that must have electrical connections therebetween in order to interoperate. Typically, the chip real estate is divided into different regions with each particular component being assigned a particular region of the "floorplan." For example, a particular region is reserved for a memory controller, another region for a processor core, etc. These regions are referred to as "active regions." Typically, a thin channel ("non-active region") separates the active regions. As described below, portions of the non-active region can be reserved for repeaters to improve signal transmission between the components. However, as more of the floorplan is used as active regions for components, less of the floorplan is available as a non-active region. This is true of systems-on-a-chip (SoCs), as well as other integrated circuits.

In order for the different components to interoperate, thousands of electrical connections are needed to route signals between the components. Typically, the signal routes are implemented in metal layers above the chip substrate. A particular signal route often requires one or more repeaters to assure proper signal propagation. For example, the signal route may have an RC delay due to electrical resistance of the metal used for the signal path and capacitive coupling between the metal and other electrical connections. Electrically connecting a repeater to a signal path can reduce or eliminate the RC delay. A repeater may also improve other signal propagation characteristics such as signal shape. Since the repeaters are not at the metal layers used for the signal paths, the signal path is typically routed down to the input and output of a repeater. Unfortunately, determining which repeater to use for each signal route is complex and time consuming. Moreover, the process of routing the signal path to the assigned repeater significantly complicates the overall routing of signal paths.

Typically, the process of assigning repeaters to signal paths and routing the signal paths is iterative. For example, during a floor planning stage, a portion of the channels is reserved for repeaters. This is followed by a first pass at determining signal routes in the metal layers for the needed electrical connections, which generates a "netlist" of electrical connections. Then, an attempt is made to assign repeaters to whatever signal routes need them. However, typically this attempt fails to assign a repeater to each signal route that needs one or more repeaters. Moreover, many of the repeater assignments are poorly optimized in that a significant detour must be made from the signal path to route it to the repeater. In some cases, the locations in the floor plan that are reserved for the repeaters are modified and the process is repeated. The new locations for the repeaters may be based, at least in part, on an analysis of the timing of the signal routes, factoring in the detours to get to the repeaters.

As integrated circuits become more complex and compact, the challenge of routing the signal paths and assigning repeaters becomes more difficult. Further, as integrated circuits become more complex, the channel size becomes smaller. Thus, finding suitable repeaters locations is becoming more difficult.

Another problem with these techniques for routing signal paths is the unpredictability of the correlation between the original routing solution and the final routing solution after the iterations have converged to a final routing solution. Because designers rely on the original routing solution to perform early full chip timing analysis, if the final routing solution does not correlate well with the original routing solution then the early timing analysis will not be valid.

Because of these and potentially other drawbacks, this approach does not provide wholly satisfactory results. Consequently, an improved method and system for routing signal paths and assigning repeaters to signal paths during an integrated circuit design process is desired.

SUMMARY

In accordance with one embodiment of the present invention, there is provided a method of assigning repeaters to signal paths in an integrated circuit. More particularly, an embodiment of the present invention comprises the following. The method involves reserving, in a first metal layer of the integrated circuit design, metal tracks for routing signals. Access points to a plurality of repeaters are reserved in a second metal layer of the integrated circuit design. Each access point may be associated with a particular repeater. For example, an access point might be associated with an input of a particular repeater or an output of the particular repeater. The number of repeaters may be based on the number of metal tracks that are available to route signals through the first region. For example, the number of repeaters may be sufficient to provide at least one repeater for each metal track that is available to route a signal through the first region. One or more metal layers may reside between the repeater access points and the repeaters. The first metal layer and the second metal layer are adjacent metal layers, in one embodiment. Each of a plurality of signal paths is assigned a route that comprises at least a portion of one or more of the metal tracks. A determination is made as to which of the signal paths requires a repeater to meet a design constraint. Access points of a particular repeater are assigned to a signal path that requires a repeater. Further, a route from the signal path to the access points may be determined. Thus, a repeater is assigned to a particular signal path.

Notice that the assignment of repeaters to signal paths does not require significant routing detours to be taken in order for a repeater to be inserted into a signal path. For example, because an access point is associated with a particular repeater, no routing detours need to be taken at metal layers between the access points and the repeater to stitch in the repeater. Because the effect that stitching in the repeaters will have on signal path timing is predictable, signal path timing analysis prior to repeater hookup remain valid. Thus, performing the signal path timing analysis does not need to wait until repeaters are stitched in. Furthermore, the method is compatible with existing techniques for designing integrated circuits.

DETAILED DESCRIPTION OF EMBODIMENT(S)

Overview of Predictable Repeater Routing in an Integrated Circuit Design

Figure 1:
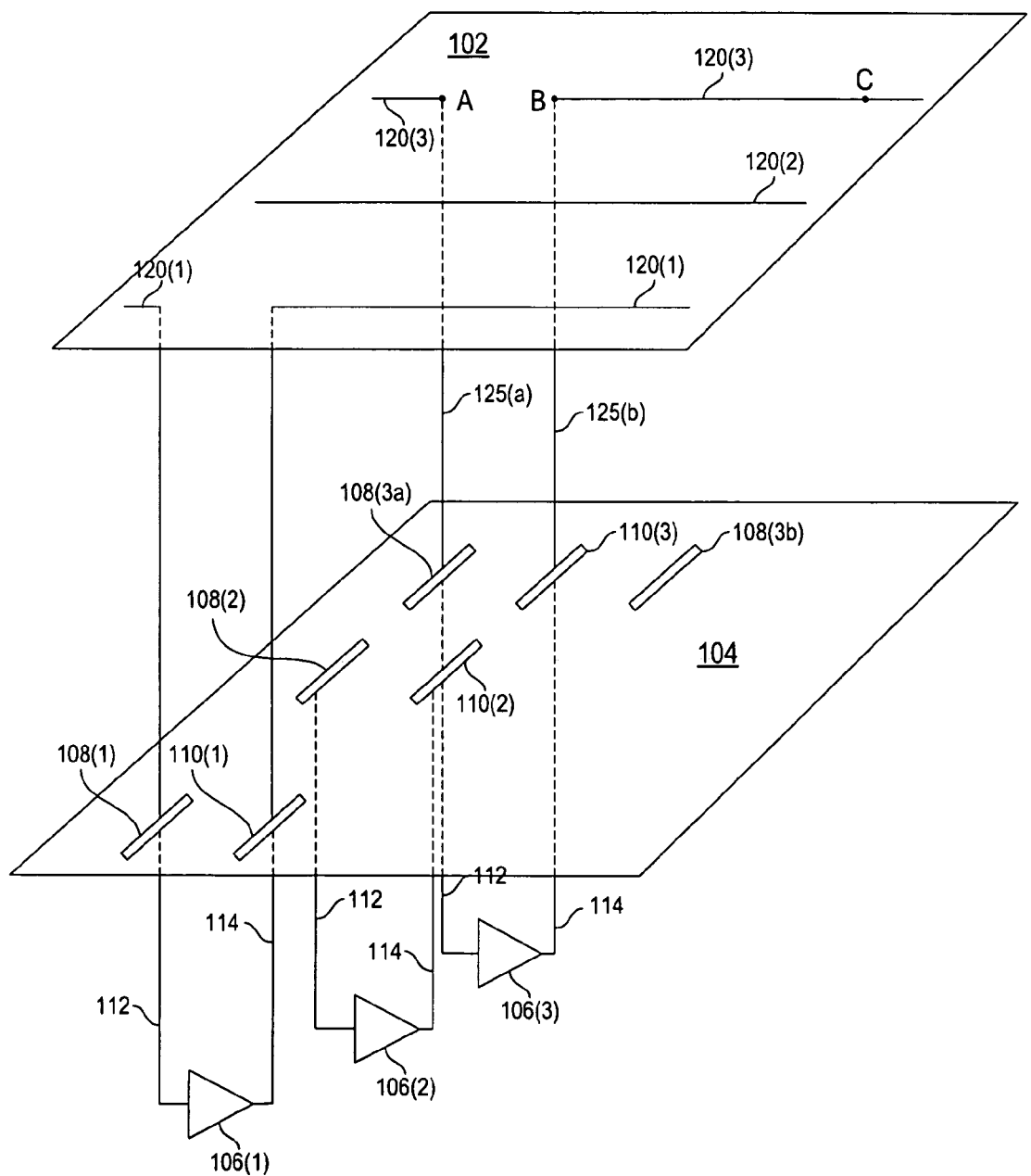
FIG. 1 is a diagram illustrating repeater access points in one metal layer and signal paths in an adjacent metal layer, in accordance with an embodiment of the present invention.

FIG. 1 shows a perspective view of a portion of an integrated circuit illustrating locations that are reserved for repeater access points in a metal layer and signal path locations in another metal layer, in accordance with an embodiment of the present invention. FIG. 1 shows two metal layers 102, 104, as well as repeaters 106(1)-106(3), which have reserved locations elsewhere in the integrated circuit. A repeater may be implemented using a buffer, inverter, etc. There may be many metal layers (not depicted in FIG. 1) between the repeaters 106 and the metal layer 104. The metal tracks in metal layer 104 run perpendicular to the metal tracks in metal layer 102, in the embodiment depicted in FIG. 1. The two metal layers 102, 104 are adjacent metal layers, in one embodiment.

Metal layer 104 has repeater input access points 108(1), 108(2), 108(3a), 108(3b) and repeater output access points 110(1)-110(3). The input of each repeater 106 has a dedicated input access point 108, in this embodiment. Similarly, the output of each repeater 106 has a dedicated output access point, in this embodiment. A via 112 may be used to electrically connect an input access point 108 to a repeater 106. Similarly, a via 114 may be used to electrically connect an output access point 110 to a repeater output. Structures other than vias may be used, if so desired. Note that the configuration of the access points 108, 110 allows an electrical connection between an access point 108 or 110 and a repeater 106 to be made without having to determine a complex route through any metal layers that may separate the repeaters 106 and the access points 108, 110.

In the embodiment of FIG. 1, the reserved locations for access points 108, 110 are rows that coincide with the direction in which metal tracks may run in metal layer 104. Only a few access points 108, 110 are depicted in FIG. 1, so as to not obscure the diagram. However each row may have many more access points. Moreover, metal layer 104 may have other rows of repeater access points (not shown in FIG. 1 so as to not obscure the diagram).

Further, an input to a particular repeater 106 may have multiple access points. For example, repeater 106(3) has two input access points 108(3a), 108(3b). The use of the second input access point will be explained later. An output of a particular repeater 106 may have multiple access points, as well.

The portion of metal layer 102 depicted in FIG. 1 is capable of supporting three metal tracks, based on design constraints such as track width, process limitations, etc. Thus, three signal paths could be assigned to the metal tracks during a routing stage. The metal tracks are not explicitly depicted in FIG. 1; rather the signal paths 120(1)-120(3) in metal layer 102 are depicted. In order to comply with various design constraints, some of the signal paths 120 should have a repeater "stitched in". The design constraints may include factors including, but not limited to, length of the signal path, resistance of the metal track, capacitive coupling between metal tracks, and frequency of signal transmission. To illustrate, signal path 120(1) has repeater 106(1) stitched in and signal path 120(3) has repeater 106(3) stitched in.

Due to the configuration of this embodiment, stitching in a repeater 106 to a signal path 120 can be accomplished by the use of a pair of vias between metal layer 102 and 104. For example, vias 125a and 125b are used to stitch repeater 106 (3) into signal path 120(3). However, structures other than vias may be used, if so desired. Note that no complex routing is required in order to stitch in the repeater 106(3).

Further note that because complex routing is not required to stitch in the repeaters, the effect that stitching in the repeaters will have on signal path timing is predictable. Therefore, signal path timing analysis performed prior to repeater hookup can remain valid. Thus, performing the signal path timing analysis does not need to wait until repeaters are stitched in. For example, the signal path between point A and point B, along with its characteristics, can be reliably predicted even before repeater 106(3) is stitched in to signal path 120(3). More particularly, a simulation program can correctly simulate the correct RC phi network for timing analysis. Timing analysis can be performed for any or all signal paths 120 prior to stitching in repeaters 106 with the results of the timing analysis being valid because of the predictability of the effect on timing that stitching in a repeater will have.

Figure 2:
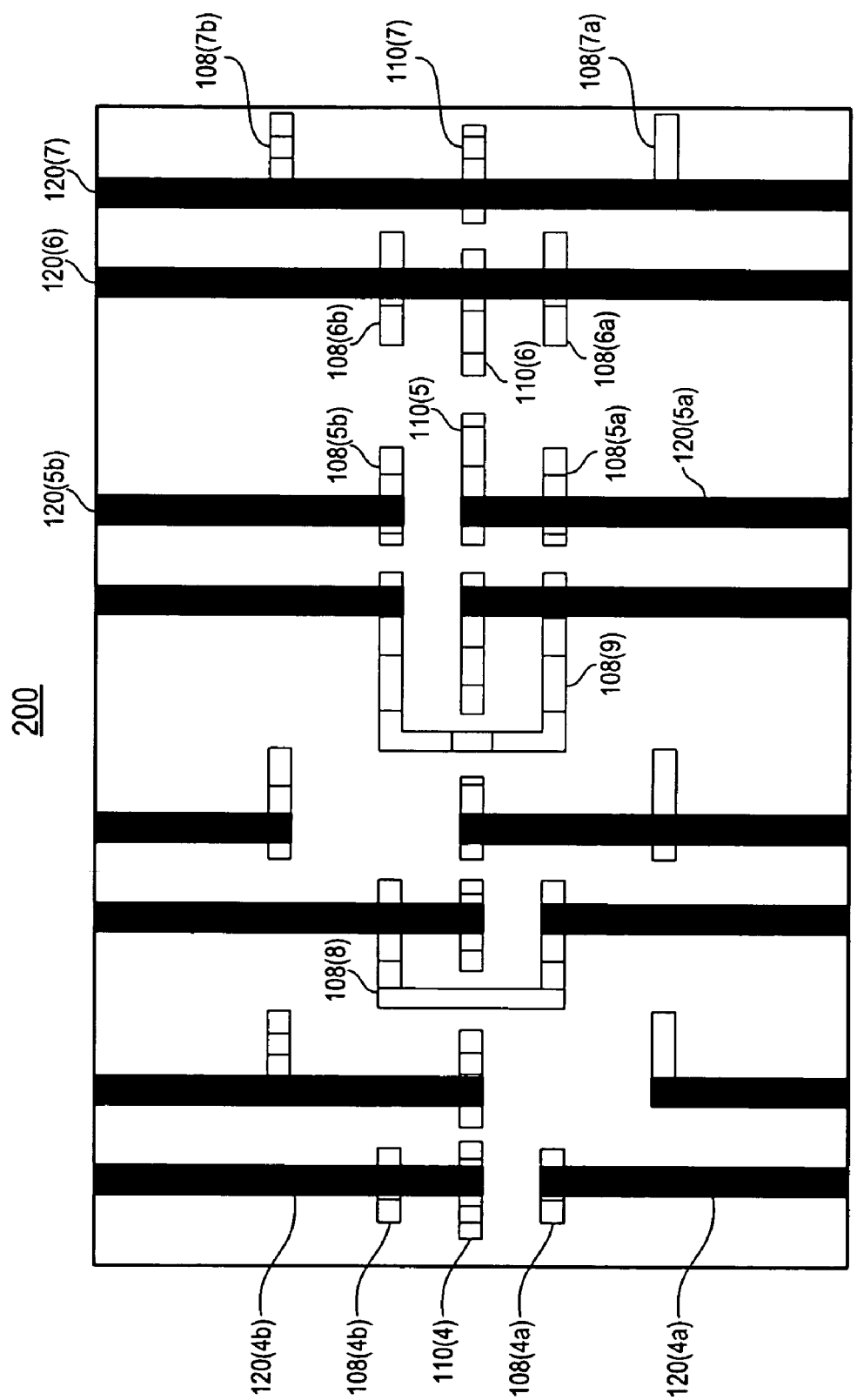
FIG. 2 is a floor plan diagram illustrating repeater access points and signal path locations, in accordance with an embodiment of the present invention.

FIG. 2 shows a floor plan 200 illustrating an example layout for repeater access points and signal paths that can be implemented in metal tracks, in accordance with an embodiment of the present invention. The example floor plan 200 depicts elements in two metal layers. These metal layers could be similar to metal layers 102 and 104 of FIG. 1. The repeater access points 108, 110 can have a variety of different configurations. For example, the input access points 108 could have a horseshoe configuration, as with input access points 108(8) and 108(9). Other access points 108 could have two separate input access points (e.g., 108(4a) and 108(4b)). Many other configurations could be used.

Each signal path 120 passes over the access points 108, 110 for a particular repeater, in this embodiment. This allows the electrical connection between a signal path 120 and an access point 108, 110 to be made with a via between the metal layers. However, it is not required that the signal path 120 pass directly over the access points 108, 110. In this embodiment, each signal path 120 is associated with set of access points 108, 110 for a particular repeater. In general, the number of sets of access points 108, 110 is based on the number of signal paths 120 that can pass through the region. For example, the number of sets of access points 108, 110 could match the number of signal paths 120. However, it is not required that there be exactly one set of access points 108, 110 for each signal path 120.

The signal paths 120 are electrically coupled to the access points 108, 110 based on direction of travel of the signal, in this embodiment. For example, signal path 120(4a) is coupled to input access point 108(4a) and signal path 120 (4b) is coupled to output access point 110(4). Input access point 108(4b) is not used for this routing configuration. As another example, signal path 120(5b) is coupled to input access point 108(5b) and signal path 120(5a) is coupled to output access point 110(5). Input access point 108(5a) is not used for this routing configuration.

Signal paths 120(6) and 120(7) do not require a repeater in order to meet design constraints. Therefore, signal paths 120 (6) and 120(7) do not have vias electrically connecting them to the repeater access points 108(6a), 108(6b), 110(6), 108 (7a), 108(7b), and 110(7) below. However, those repeater access points remain available for signal paths 120(6), 120(7) should there be a need. For example, consider the case in which the path length of the signal that is routed though signal path 120(6) were to be increased. Such a change might require a repeater to be stitched in. Because the repeater access points are available for metal track 120(6), no complex routing changes need to be made to stitch in the repeater.

Assigning Repeaters to Signal Paths in an Integrated Circuit Design

Figure 3:
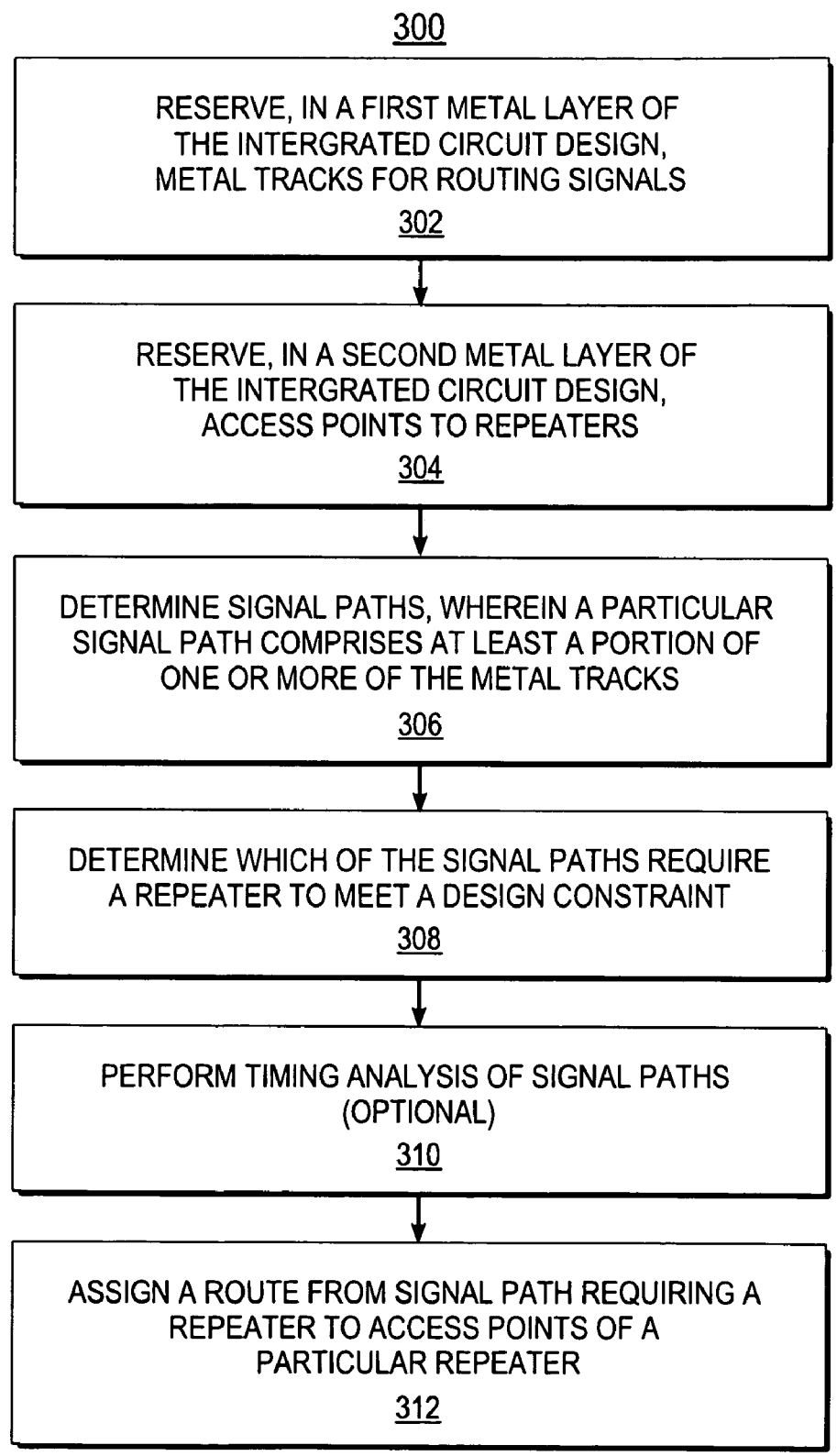
FIG. 3 is a flowchart illustrating steps of a process of assigning repeaters to signal paths in an integrated circuit design, in accordance with an embodiment of the present invention.

FIG. 3 illustrates steps of a process 300 of assigning repeaters to signal paths in an integrated circuit. Conventional chip integration flow requires the designer to route the chip once (signal route), insert repeaters, generate a new design netlist, and route the chip again (repeater route). Process 300 does not require a total re-route of the chip after repeater insertion, in accordance with an embodiment of the present invention.

In step 302, metal tracks for routing signals are reserved, in a first metal layer of the integrated circuit design. In one embodiment, a determination is made as to how many metal tracks can be used in a particular region of the first metal layer. The region of interest is a region in the first metal layer above a portion of the floor plan that allows repeaters to be located. Repeaters can be located anywhere in the floorplan, but are commonly located in a channel region between functional blocks. For example, the floorplan is typically divided into functional blocks that are dedicated to a particular function with channels between the blocks. Thus, the first region may be a portion of the first metal layer that is above a channel between two functional blocks.

In step 304, repeater access points are reserved in a second metal layer of the integrated circuit design. Each access point may be associated with a particular repeater. For example, an access point might be associated with an input of a particular repeater or an output of the particular repeater. The first metal layer and the second metal layer are adjacent metal layers, in one embodiment. The number of repeaters is based on the number of metal tracks that are available to route signals through the first region. For example, the number of repeaters may be sufficient to provide at least one repeater for each metal track that is available to route a signal through the first region. However, it is not required that the number of repeaters exactly match the number of metal tracks.

In step 306, signal paths that use at least a portion of one or more of the metal tracks are determined. For example, signal paths might electrically connect two components on the chip. FIG. 1 shows a portion of signal paths, but not the components.

In step 308, a determination is made as to which of the signal paths should have a repeater to meet a design constraint. This determination may be based on design constraints such as the pitch of the metal tracks, etc. A computer program may be used to determine which signal paths should have a repeater and to handle assigning and stitching in the repeater. For signal paths that require a repeater, the program "cuts" a short segment of the signal path near the repeater access points, in one embodiment. For example, referring to FIG. 1, a small portion of the signal paths 120(1) and 120(3) are cut above the repeater access points 108, 110. The program allows the cut length to be input by the chip designer. Thus, for example, the cut point might be at point C on signal path 120(3). Moreover, a different cut length can be used for different metal layers. The longer the cut length, the more freedom the program will have in accessing repeater access point 108, 110. However, allowing a longer cut length may decrease the predictability of what route will result after repeater insertion.

In optional step 310, timing analysis is performed on the signal paths. Note that the timing analysis may be performed prior to routing the repeaters. Because the effect that stitching in the repeaters will have on signal path timing is predictable, the signal path timing analysis prior to repeater hookup can be valid. Thus, performing the signal path timing analysis does not need to wait until repeaters are stitched in.

In step 312, for each of the signal paths requiring repeaters, a route is determined from the signal path to access points for a particular repeater. Thus, the signal paths are associated with a particular repeater. The process of assigning repeaters to signal paths produces a design netlist, in one embodiment. A computer program may assign the same net name for the different segments of a metal track that is cut into segments, with different suffixes being used to differentiate between the segments. However, other naming conventions could be used. In one embodiment, the computer program reads in the names of the cut segments (with suffixes) and the un-cut segments to perform repeater routing. This routing is very efficient as the program may only need to connect a very short wire from the cut metal wires to the repeater access points. For example, in FIG. 1, connecting signal path 120(3) to repeater 106(3) can be accomplished with vias 125a and 125b. In some cases, additional routing may be used between the signal path 120 and the access points 108, 110.

Routing the signal paths is very efficient using process 300. Moreover, the effect the final route (with repeaters hooked up) will have on timing is predictable. Therefore, a reliable timing analysis can be performed based on the original signal route and the estimated timing effect of routing the repeaters. In many cases, the majority of signal paths will be connected to repeaters either by vias or use very short wire distances. Therefore, the short wire distance delay can be easily estimated by a computer program. Thus, this delay can be factored into a timing analysis of the original signal route (with the knowledge that repeaters will be inserted at appropriate locations). Moreover, process 300 can reduce or eliminate the need for many iterations of signal routing and re-routing attempting to optimize the signal path.

In some cases, the initial routing of the repeaters may not lead to the most efficient signal paths. For example, it may be possible that reversing the repeater access points that are assigned to two signal paths could improve the routing. As a particular example, it might be that originally signal path 120(3) might have been assigned to access points 108(2) and 110(2). In this case, a re-assignment could be performed. Therefore, in one embodiment, after repeater routing, repeater access points may be re-assigned to different signal paths. Such swapping of access point assignments can improve timing by reducing signal path lengths.

Assigning Embedded Repeaters

An embodiment of the present invention involves assigning embedded repeaters to signal paths. In some cases, the length of the signal path 120 that crosses over a functional block is so long that a repeater should be stitched in to a point of the signal path 120 that passes over the functional block. An embedded repeater is a repeater that is located somewhere in a functional block, as opposed to a channel of the integrated circuit. In other words, an embedded repeater is located in an "active region" as opposed to a "non-active region."

In this embodiment, a determination may be made as to where within a functional block an embedded repeater might be needed. This determination may be based on factors such as the length across the functional block. Access points 108, 110 to the embedded repeaters may be reserved in a metal layer above the functional block. Thus, the access points 108, 110 are not necessarily above a non-active region of the integrated circuit design. For each signal path 120 that requires a repeater at a point over the functional block, a route is determined from the signal path 120 to the access points 108, 110 above the functional block. This route can be very easily determined and is achieve by a via, in one embodiment.

By routing the signal path 120 to the access points 108, 110 above the functional block, the signal path 120 is assigned to an embedded repeater.

Hardware Overview

Figure 4:
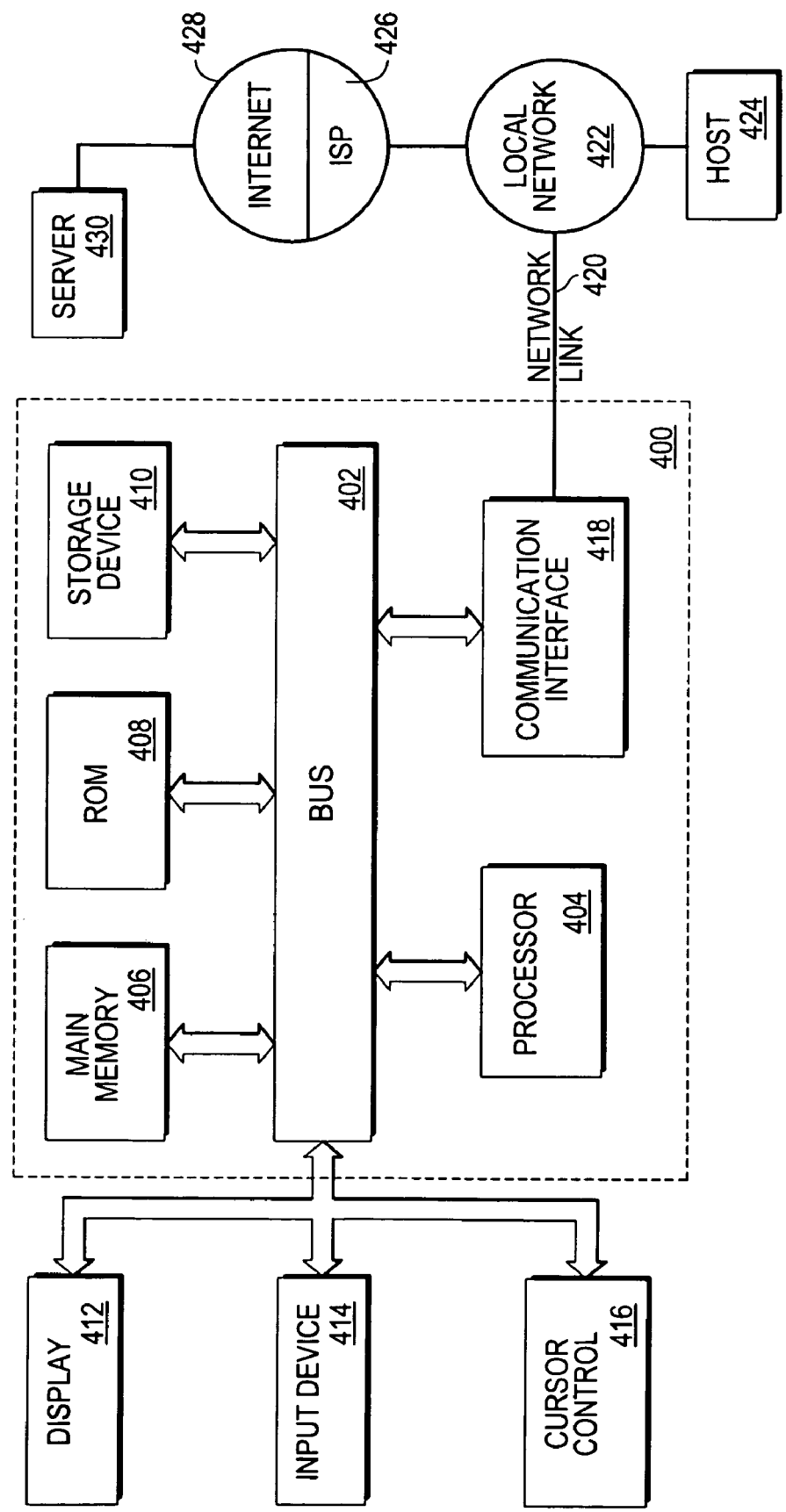
FIG. 4 is a diagram illustrating a computer system upon which an embodiment of the present invention may be practiced.

In one embodiment, steps of process 300 may take the form of sets of instructions that are executed by one or more processors. If they take the form of sets of instructions, FIG. 4 shows a block diagram of a computer system 400 upon which these sets of instructions may be executed. Computer system 400 includes a bus 402 for facilitating information exchange, and one or more processors 404 coupled with bus 402 for processing information. Computer system 400 also includes a main memory 406, such as a random access memory (RAM) or other dynamic storage device, coupled to bus 402 for storing information and instructions to be executed by processor 405. Main memory 406 also may be used for storing temporary variables or other intermediate information during execution of instructions by processor 405. Computer system 400 may further include a read only memory (ROM) 408 or other static storage device coupled to bus 402 for storing static information and instructions for processor 405. A storage device 410, such as a magnetic disk or optical disk, is provided and coupled to bus 402 for storing information and instructions.

Computer system 400 may be coupled via bus 402 to a display 412 for displaying information to a computer user. An input device 414, including alphanumeric and other keys, is coupled to bus 402 for communicating information and command selections to processor 405. Another type of user input device is cursor control 416, such as a mouse, a trackball, or cursor direction keys for communicating direction information and command selections to processor 404 and for controlling cursor movement on display 412. This input device typically has two degrees of freedom in two axes, a first axis (e.g., x) and a second axis (e.g., y), that allows the device to specify positions in a plane.

In computer system 400, bus 402 may be any mechanism and/or medium that enables information, signals, data, etc., to be exchanged between the various components. For example, bus 402 may be a set of conductors that carries electrical signals. Bus 402 may also be a wireless medium (e.g. air) that carries wireless signals between one or more of the components. Bus 402 may further be a network connection that connects one or more of the components. Any mechanism and/or medium that enables information, signals, data, etc., to be exchanged between the various components may be used as bus 402.

Bus 402 may also be a combination of these mechanisms/media. For example, processor 404 may communicate with storage device 410 wirelessly. In such a case, the bus 402, from the standpoint of processor 404 and storage device 410, would be a wireless medium, such as air. Further, processor 404 may communicate with ROM 408 capacitively. Further, processor 404 may communicate with main memory 406 via a network connection. In this case, the bus 402 would be the network connection. Further, processor 404 may communicate with display 412 via a set of conductors. In this instance, the bus 402 would be the set of conductors. Thus, depending upon how the various components communicate with each other, bus 402 may take on different forms. Bus 402, as shown in FIG. 4, functionally represents all of the mechanisms and/or media that enable information, signals, data, etc., to be exchanged between the various components.

The invention is related to the use of computer system 400 for implementing the techniques described herein. According to one embodiment of the invention, those techniques are performed by computer system 400 in response to processor 404 executing one or more sequences of one or more instructions contained in main memory 406. Such instructions may be read into main memory 406 from another machine-readable medium, such as storage device 410. Execution of the sequences of instructions contained in main memory 406 causes processor 404 to perform the process steps described herein. In alternative embodiments, hard-wired circuitry may be used in place of or in combination with software instructions to implement the invention. Thus, embodiments of the invention are not limited to any specific combination of hardware circuitry and software.

The term "machine-readable medium" as used herein refers to any medium that participates in providing data that causes a machine to operation in a specific fashion. In an embodiment implemented using computer system 400, various machine-readable media are involved, for example, in providing instructions to processor 404 for execution. Such a medium may take many forms, including but not limited to, non-volatile media, volatile media, and transmission media. Non-volatile media includes, for example, optical or magnetic disks, such as storage device 410. Volatile media includes dynamic memory, such as main memory 406. Transmission media includes coaxial cables, copper wire and fiber optics, including the wires that comprise bus 402. Transmission media can also take the form of acoustic or light waves, such as those generated during radio-wave and infra-red data communications.

Common forms of machine-readable media include, for example, a floppy disk, a flexible disk, hard disk, magnetic tape, or any other magnetic medium, a CD-ROM, DVD, or any other optical storage medium, punchcards, papertape, any other physical medium with patterns of holes, a RAM, a PROM, an EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 404 for execution. For example, the instructions may initially be carried on a magnetic disk of a remote computer. The remote computer can load the instructions into its dynamic memory and send the instructions over a telephone line using a modem. A modem local to computer system 400 can receive the data on the telephone line and use an infra-red transmitter to convert the data to an infra-red signal. An infra-red detector can receive the data carried in the infra-red signal and appropriate circuitry can place the data on bus 402. Bus 402 carries the data to main memory 406, from which processor 404 retrieves and executes the instructions. The instructions received by main memory 406 may optionally be stored on storage device 410 either before or after execution by processor 405.

Computer system 400 also includes a communication interface 418 coupled to bus 402. Communication interface 418 provides a two-way data communication coupling to a network link 420 that is connected to a local network 422. For example, communication interface 418 may be an integrated services digital network (ISDN) card or a modem to provide a data communication connection to a corresponding type of telephone line. As another example, communication interface 418 may be a local area network (LAN) card to provide a data communication connection to a compatible LAN. Wireless links may also be implemented. In any such implementation, communication interface 418 sends and receives electrical, electromagnetic or optical signals that carry digital data streams representing various types of information.

Network link 420 typically provides data communication through one or more networks to other data devices. For example, network link 420 may provide a connection through local network 422 to a host computer 424 or to data equipment operated by an Internet Service Provider (ISP) 426. ISP 426 in turn provides data communication services through the world wide packet data communication network now commonly referred to as the "Internet" 428. Local network 422 and Internet 428 both use electrical, electromagnetic or optical signals that carry digital data streams. The signals through the various networks and the signals on network link 420 and through communication interface 418, which carry the digital data to and from computer system 400, are exemplary forms of carrier waves transporting the information.

Computer system 400 can send messages and receive data, including program code, through the network(s), network link 420 and communication interface 418. In the Internet example, a server 430 might transmit a requested code for an application program through Internet 428, ISP 426, local network 422 and communication interface 418.

The received code may be executed by processor 404 as it is received, and/or stored in storage device 410, or other non-volatile storage for later execution. In this manner, computer system 400 may obtain application code in the form of a carrier wave.

At this point, it should be noted that although the invention has been described with reference to a specific embodiment, it should not be construed to be so limited. Various modifications may be made by those of ordinary skill in the art with the benefit of this disclosure without departing from the spirit of the invention. Thus, the invention should not be limited by the specific embodiments used to illustrate it but only by the scope of the issued claims and the equivalents thereof.

What is claimed is:

1. A machine implemented method for assigning repeaters to signal paths in an integrated circuit design, the method comprising:
   reserving, in a first metal layer of the integrated circuit design, metal tracks for routing signals;
   reserving, in a second metal layer of the integrated circuit design, access points to a plurality of repeaters, wherein each repeater is associated with access points for the repeater, and wherein: (1) at least one repeater has a plurality of distinct access points reserved for its input; or (2) at least one repeater has a plurality of distinct access points reserved for its output;
   determining a plurality of signal paths, wherein each signal path comprises at least a portion of one or more of the metal tracks;
   determining which of the signal paths require a repeater to meet a design constraint; and
   for each of the signal paths that requires a repeater, assigning a route from the signal path to access points of a particular repeater, wherein the signal path is assigned to the particular repeater.

2. The method of claim 1, wherein the first metal layer and the second metal layer are adjacent metal layers.

3. The method of claim 1, wherein the number of repeaters is based on the number of metal tracks that are available to route signals through the first metal layer.

4. The method of claim 3, wherein the number of repeaters is sufficient to provide at least one repeater for each metal track that is available to route a signal through the first metal layer.

5. The method of claim 1, wherein each of the plurality of signal paths is assigned a route prior to assigning a repeater to any of the signal paths that requires a repeater.

6. The method of claim 1, further comprising determining a route from a repeater to access points to the repeater prior to assigning the repeater to a signal path.

7. The method of claim 1, further comprising:
   prior to determining routes from access points of repeaters that are assigned to signal paths to the repeaters, performing a timing analysis of the signal paths.

8. The method of claim 1, further comprising the step of reserving a region for the repeaters, wherein at least one layer resides between the access points and the repeaters.

9. The method of claim 1, wherein the step of assigning a route from the signal path to access points of a particular repeater for each of the signal paths that requires a repeater is not performed until substantially all signal paths have been assigned a route that comprises at least a portion of one or more of the metal tracks.

10. The method of claim 1, further comprising determining locations for repeaters to be embedded in a functional block of the integrated circuit design by performing the following:
    based on potential length of a signal path across the functional block, determining a location for which a repeater may be needed to satisfy one or more design constraints that limits the length of a signal path.

11. A machine readable storage medium having stored thereon a set of instructions which, when executed by one or more processors, causes the one or more processors to perform the following operations:
    reserve, in a first metal layer of the integrated circuit design, metal tracks for routing signals;
    reserve, in a second metal layer of the integrated circuit design, access points to a plurality of repeaters, wherein each repeater is associated with access points for the repeater, and wherein: (1) at least one repeater has a plurality of distinct access points reserved for its input; or (2) at least one repeater has a plurality of distinct access points reserved for its output;
    determine a plurality of signal paths, wherein each signal path comprises at least a portion of one or more of the metal tracks;
    determine which of the signal paths require a repeater to meet a design constraint; and
    for each of the signal paths that requires a repeater, assign a route from the signal path to access points of a particular repeater, wherein the signal path is assigned to the particular repeater.

12. The machine readable storage medium of claim 11, wherein the first metal layer and the second metal layer are adjacent metal layers.

13. The machine readable storage medium of claim 11, wherein the number of repeaters is based on the number of metal tracks that are available to route signals through the first metal layer.

14. The machine readable storage medium of claim 13, wherein the number of repeaters is sufficient to provide at least one repeater for each metal track that is available to route a signal through the first metal layer.

15. The machine readable storage medium of claim 11, wherein each of the plurality of signal paths is assigned a route prior to assign a repeater to any of the signal paths that requires a repeater.

16. The machine readable storage medium of claim 11, wherein the set of instructions further comprise instructions that when executed by the one or more processors, cause the one or more processors to perform the following operation:
    determine a route from a repeater to access points of the repeater prior to assigning the repeater to a signal path.

17. The machine readable storage medium of claim 11, wherein the set of instructions further comprise instructions that when executed by the one or more processors, cause the one or more processors to perform, the following operation:

prior to determining routes from access points of repeaters that are assigned to signal paths to the repeaters, perform a timing analysis of the signal paths.

18. The machine readable storage medium of claim 11, wherein the set of instructions further comprise instructions that when executed by the one or more processors, cause the one or more processors to perform the operation:

reserve a region for the repeaters, wherein at least one layer resides between the access points and the repeaters.

19. The machine readable storage medium of claim 11, wherein the set of instructions that perform the operation of assigning a route from the signal path to access points of a particular repeater for each signal path that requires a repeater do not perform the assign operation until a set of instructions performs the operation:

assign substantially all signal paths a route that comprises at least a portion of one or more of the metal tracks.

20. The machine readable storage medium of claim 11, wherein the set of instructions further comprise instructions that when executed by the one or more processors, cause the one or more processors to perform the following operation:

determine locations for repeaters to be embedded in a functional block of the integrated circuit design by performing the following:

based on potential length of a signal path across the functional block, determine a location for which a repeater may be needed to satisfy one or more design constraints that limits the length of a signal path.

* * * * *